United States Patent [19]

Roeschert et al.

[11] Patent Number: 5,302,488
[45] Date of Patent: Apr. 12, 1994

[54] RADIATION-SENSITIVE POLYMERS CONTAINING NAPHTHOQUINONE-2-DIAZIDE-4-SULFONYL GROUPS AND THEIR USE IN A POSITIVE WORKING RECORDING MATERIAL

[75] Inventors: Horst Roeschert, Ober-Hilbersheim, Fed. Rep. of Germany; Hans-Joachim Merrem, Basking Ridge, N.J.; Georg Pawlowski, Wiesbaden; Juergen Fuchs, Floersheim/Wicker, both of Fed. Rep. of Germany; Ralph Dammel, Coventry, R.I.

[73] Assignee: Hoechst Aktiengesellschaft, Frankfurt am Main, Fed. Rep. of Germany

[21] Appl. No.: 841,545

[22] Filed: Feb. 26, 1992

[30] Foreign Application Priority Data

Feb. 28, 1991 [DE] Fed. Rep. of Germany ....... 4106356

[51] Int. Cl.$^5$ .............................................. G03F 7/023
[52] U.S. Cl. .................................... 430/190; 430/165; 430/192; 430/193; 534/557
[58] Field of Search ...................... 430/190, 192, 193; 534/557

[56] References Cited

U.S. PATENT DOCUMENTS

| | | |
|---|---|---|
| 3,779,778 | 12/1973 | Smith et al. |
| 3,837,860 | 9/1974 | Roos . |
| 3,902,906 | 9/1975 | Iwama et al. . |
| 4,139,384 | 2/1979 | Iwasaki et al. .................... 430/165 |
| 4,308,368 | 12/1981 | Kubo et al. ........................ 525/504 |
| 4,910,123 | 3/1990 | Endo et al. ........................ 430/326 |
| 5,178,986 | 1/1993 | Zampini et al. ................... 430/190 |

FOREIGN PATENT DOCUMENTS

| | | |
|---|---|---|
| 0111274 | 6/1984 | European Pat. Off. . |
| 0242143 | 10/1987 | European Pat. Off. . |
| 0307828 | 3/1989 | European Pat. Off. . |
| 0449272 | 10/1991 | European Pat. Off. . |
| 3028308 | 2/1982 | Fed. Rep. of Germany . |
| 3930087 | 3/1991 | Fed. Rep. of Germany . |
| 01106037 | 4/1989 | Japan . |
| 1494640 | 12/1977 | United Kingdom . |

OTHER PUBLICATIONS

Willson (1983) *Introduction to Microlithography: Theory, Materials and Processing* 219(3):87–159.
Sugiyama et al. (Nov. 1988) 51–61, positive excimer laser resists prepared with aliphatic diazoketones.
Tani et al. (1989) *SPIE: Advances in Resist Technology and Processing VI* 1086: 22–33, a new positive resist KrF excimer laser lithography.
Schwartzkopf (1988) *SPIE: Advances in Resist Technology and Processing V* 920: 51–58, 2-diazocyclohexane-1,3-dione photoactive compounds for deep U.V. lithography.
Willson et al. (1987) *SPIE: Advances in Resist Technology and Processing IV* 771: 1–10, new diazoketone dissolution inhibitors for deep U.V. photolithography.
Crivello (Dec. 1983) *Polymer Engineering and Science* 23(17): 953–956, possibilities for photoimaging using onium salts.
Houlihan et al. (1988) *SPIE: Advances in Resist Technology and Processing V* 920: 67–74, an evaluation of nitrobenzyl ester chemistry for chemical amplification resists.
Patent Abstracts of Japan, vol. 5, No. 88 (P-65) Jun. 9, 1981 & JP-A-56 035 129.
Patent Abstracts of Japan, vol. 13, No. 242 (P-880) Jun. 7, 1989 & JP-A-1 044 934.

*Primary Examiner*—Charles L. Bowers, Jr.
*Assistant Examiner*—Christopher G. Young
*Attorney, Agent, or Firm*—Foley & Lardner

[57] ABSTRACT

A radiation-sensitive polymer and a mixture containing this radiation-sensitive polymer as a binder are disclosed. A process for the preparation of the radiation-sensitive polymer binder and a positive-working radiation-sensitive recording material which is prepared using the radiation-sensitive mixture are also disclosed.

24 Claims, No Drawings

RADIATION-SENSITIVE POLYMERS CONTAINING NAPHTHOQUINONE-2-DIAZIDE-4-SULFONYL GROUPS AND THEIR USE IN A POSITIVE WORKING RECORDING MATERIAL

BACKGROUND OF THE INVENTION

The present invention relates to radiation-sensitive polymers, to a mixture containing these radiation-sensitive polymers as binder, and to a positive-working radiation-sensitive recording material which is prepared using the radiation-sensitive mixture. The recording material is particularly suitable for the production of photoresists, electronic components and printing plates, and for chemical milling.

Positive-working, radiation-sensitive mixtures have been known for a long time. The use of the mixtures in radiation-sensitive copying materials, such as blueprinting papers, planographic printing plates, colorproof sheets, and dry and liquid resists, and for chemical milling, has frequently been described.

The continuing miniaturization of structures, for example, in chip production, down to the range of less than 1 $\mu$m, demands modified lithographic techniques. In order to obtain an image of such fine structures, short wavelength radiation is used, such as high-energy UV light, electron beams and X-rays. The radiation-sensitive mixture must be suited to the shortwave radiation. The demands which must be met by the radiation-sensitive mixture are listed in an article by C. G. Willson "Organic Resist Materials Theory and Chemistry" (*Introduction to Microlithography, Theory, Materials, and Processing*, edited by L. F. Thompson, C. G. Willson, M. J. Bowden, ACS Symp. Ser. 219:87 (1983), American Chemical Society, Washington). There is therefore an increased demand for radiation-sensitive mixtures which can be used in the more recent technologies, such as mid-UV or deep-UV lithography, with illumination, for example, by means of excimer lasers of wavelengths of 305 nm (XeF), 248 nm (KrF) and 193 nm (ArF), electron radiation lithography and X-ray lithography. Preferably the mixtures are sensitive in a broad spectral range and, accordingly, can also be used in conventional UV lithography.

Two routes have been taken in order to improve the resolution of photoresists. On the one hand, an attempt was made to develop resists based on conventional novolaks/$\alpha$-diazocarbonyl compounds for the deep-UV range, which resists have a further reduced solubility in the non-irradiated regions. On the other hand, photoresist systems were developed which are based on the principle of "chemical amplification."

In the presence of $\alpha$-diazocarbonyl compounds, the solubility of novolaks in alkali is greatly reduced, i.e., the $\alpha$-diazocarbonyl compounds act as solubility inhibitors. In addition to the diazonaphthoquinone sulfonic acid esters, 2-diazo-1,3-dicarbonyl compounds, such as 5-diazo-Meldrum's acid, derivatives of 2-diazocyclohexane-1,3-dione and 2-diazocyclopentane-1,3-dione and aliphatic 2-diazo-1,3-dicarbonyl compounds are especially important. $\alpha$-Phosphoryl-substituted diazocarbonyl compounds and polyfunctional $\alpha$-diazo-$\beta$-ketoesters are also described as photoactive inhibitors in positive-working resists, especially those which are radiation-sensitive in the deep-UV range (DUV).

In their article "Positive Excimer Laser Resists Prepared with Aliphatic Diazoketones" (*Proc. of the Ellenville Conf.* 51, (1988)), H. Sugiyama et al. also propose $\alpha$-diazo-acetoacetates. Diazocarbonylsulfonyl chlorides are described by Y. Tani et al. [*SPIE Proc., Adv. in Resist Techn. and Proc.* 1086: 22 (1989)]. Further, diazocarbonyl and diazo-1,3-dicarbonyl compounds are given in G. Schwarzkopf [*SPIE Proc., Adv. in Resist Techn. and Proc.* 920:51 (1988)].

Upon irradiation all of these compounds rearrange to form ketene derivatives. These ketene derivatives then react further with residual moisture, which is frequently already present in the resist, to form carboxylic acids. The carboxylic acids, in turn, increase the solubility of the novolaks in aqueous-alkaline developers. However, it has been found that some of the photoactive diazocarbonyl compounds bleed from the resist layer under the relatively high processing temperatures frequently used in practice and the radiation-sensitive mixture thus loses its original activity, so that reproducible results are no longer possible.

It is true that photoactive components are known which have a lower volatility, but these, depending on their structure, show a poor compatibility in the radiation-sensitive mixture. This has an especially noticeable adverse effect when drying the radiation-sensitive layers, due to crystallization of the photoactive compound. In addition, these components are frequently sparingly soluble in the conventional solvents. Some of the diazocarbonyl compounds described additionally have the disadvantage that the carbenes formed upon irradiation do not have a stability in the matrix which is adequate for the desired carboxylic acid formation. This leads to an inadequate difference in solubility between the exposed and unexposed regions during development and thus to an undesirably high degree of layer erosion in the unexposed regions. An explanation for this phenomenon is proposed by C. G. Willson et al. in *SPIE Proc., Adv. in Resist Techn. and Proc.* 771: 2 (1987).

$\alpha$-Phosphoryl-substituted diazo compounds are not used for resists in practice, since atoms which can be used as doping agents, for example, the phosphorus contained in these compounds, has to be strictly excluded in the subsequent processing steps. It is true that the derivatives of diazoacetoacetic acid show good bleaching characteristics, but their characteristics with respect to image differentiation are poor. Radiation-sensitive recording materials containing the diazocarbonyl compounds described generally have an inadequate photosensitivity, even in combination with highly transparent binders.

Mixtures containing a binder which is insoluble in water and soluble or at least swellable in aqueous-alkaline solutions, a component which forms a strong acid under the action of actinic radiation, and a compound which can be split by acid, for example, a compound having a C—O—C or C—O—Si bond, are known in principle. See, e.g., DE 2,306,248 (=U.S. Pat. No. 3,779,778). The compounds forming a strong acid on irradiation which have been used include, in particular, onium salts such as diazonium, phosphonium, sulfonium and iodonium salts of non-nucleophilic acids, such as $HSbF_6$, $HAsF_6$, or $HPF_6$ [J. V. Crivello, *Polym. Eng. Sci.* 23:953 (1983)]. In addition, halogen compounds, in particular trichloromethyltriazine derivatives or trichloromethyloxadiazole derivatives, o-quinonediazidesulfochlorides, o-quinonediazide-4-sulfonic acid esters, organometallic/organohalogen combinations, bis(sulfonyl)diazomethanes (DE 3,930,087) or nitrobenzyltosylates [F. M. Houlihan et al., *SPIE Proc., Adv. in Resist Techn. and Proc.* 920:67 (1988)] have been recommended.

The strong acid formed upon irradiation of the materials described above splits the C—O—C or C—O—Si bonds of the acid-labile compounds. As a result, the exposed regions of the photosensitive layers become more soluble in an aqueous-alkaline developer. If shortwave radiation is used for irradiation, this demands new binders which are highly transparent at these wavelengths. Radiation-sensitive layers composed of mixtures which comprise such a highly transparent, radiation-insensitive binder, an acid-labile compound having at least one C—O—C or C—O—Si bond which can be split by acid, and a compound which forms a strong acid on irradiation, however, show a solubility in developer in the non-irradiated regions that is too high. This is reflected in an unacceptable dark-erosion rate. The consequence of this is an inadequate edge profile and a reduced resolution. Overall, the systems described above based on the principle of "chemical amplification" do have an exceptionally high photosensitivity (50 mJ/cm² and less), but an unsatisfactory resolution for structures in the range of less than about 0.5 μm.

Radiation-sensitive mixtures containing radiation-sensitive polymers have already been described for a number of applications, in particular, condensation products of novolak resins with orthoquinonediazide compounds (see, e.g., DE 3,009,873, U.S. Pat. No. 4,308,368, DE 3,028,308, and EP 242,143). However, as a result of the novolak constituent, these radiation-sensitive polymers have absorption characteristics which make them unsuitable for exposure in the DUV range.

More transparent, radiation-sensitive polymers can be prepared by a condensation reaction of hydroxyl group-containing polymers, such as poly(4-hydroxystyrene) or copolymers of pyrogallol, with ketones, and of poly-acrylates with 2,1-diazonaphthoquinone-5- and/or -4-sulfonic acid chlorides. The hydroxyl group-containing polymers have, however, an extremely high solubility in standard developers, which is reduced only after the predominant proportion of the free hydroxyl groups has reacted. This results in a high proportion of diazonaphthoquinone units, leading to unacceptable optical characteristics, especially at 248 nm. Examples of mixtures containing such polymers are given in DE 2,028,903 (=U.S. Pat. No. 3,837,860), DE 2,352,139, DE 2,461,912 (=GB 1,494,640) and EP 307,828.

Radiation-sensitive polymers having a diazocarbonyl group as photosensitive component are given in JP 01-106 037. The radiation-sensitive unit is bonded to the alkyl chain of 4-alkyl-substituted polystyrene. The polymers are characterized by low thermal stability and an inadequate sensitivity to radiation. 2-Diazo-1,3-carbonyl units bonded to conventional novolak resins have, as already discussed in detail above, a low transparency in the range of shortwave radiation and unsatisfactory bleach characteristics. Radiation-sensitive recording materials containing polymers which contain 2-diazo-1,3-dicarbonyl groups as a radiation-sensitive structural element, in particular containing maleimide/olefin copolymers, are disclosed in U.S. Pat. No. 4,910,123. These resist materials have, however, a radiation sensitivity of only about 50 mJ/cm².

SUMMARY OF THE INVENTION

It is therefore an object of the present invention to provide radiation-sensitive mixtures which have a high photosensitivity in the DUV region, but which do not have the described disadvantages of the numerous known mixtures.

It is a further object of the invention to provide a radiation-sensitive layer having good differentiation between the exposed and unexposed regions of the layer.

It is yet another object of the invention to provide radiation-sensitive mixtures that are readily compatible under the diverse process conditions used in practice and that have a high thermal stability, so that resolution in the sub-half-micrometer range is possible with an acceptable resist profile.

These and other objects according to the invention are provided by a radiation-sensitive polymer which is insoluble in water and soluble or at least swellable in aqueous-alkaline solutions, which polymer comprises (a) units of the general formula I

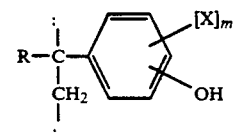

and (b) units of the general formula II

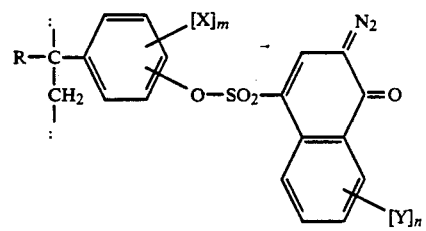

wherein the numerical ratio of units (a) to units (b) is about 98:2 to 75:25, wherein R is a hydrogen atom or a $(C_1-C_4)$alkyl group, X is a $(C_1-C_6)$alkyl, $(C_1-C_6)$alkoxy-$(C_1-C_6)$alkyl, carboxyl, formyl, $(C_1-C_{15})$alkoxycarbonyl, $(C_2-C_5)$alkanoyl, $C_2-C_5)$alkanoyloxy or $(C_1-C_6)$-alkoxy group or a halogen atom, Y is a $(C_1-C_5)$alkyl, $(C_1-C_5)$alkoxy or a halogen atom, and m and n independently of one another, are 0, 1 or 2, wherein the radicals X can be different if m=2 and the radicals Y can be different if n=2.

Also provided according to the invention is a positive-working radiation-sensitive mixture, comprising a compound containing at least C—O—C or C—O—Si bond which can be split by acid, and a binder which is insoluble in water and soluble or at least swellable in aqueous-alkaline solutions, wherein the binder contains a radiation-sensitive polymer according to the invention. The present invention also provides a positive-working, radiation-sensitive recording material, comprising a radiation-sensitive layer of the radiation-sensitive polymer according to the invention on a support material.

A method of forming an image is further provided, which comprises the steps of imagewise irradiating a positive-working, radiation-sensitive recording material according to the invention with radiation having a wavelength of about 190 to 400 nm, and developing the exposed recording material to produce a positive image.

Other objects, features and advantages of the present invention will become apparent from the following detailed description. It should be understood, however, that the detailed description and the specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Radiation-sensitive polymers according to the present invention comprise (a) units of the general formula I

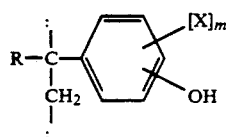

and, derived therefrom, (b) units of the general formula II

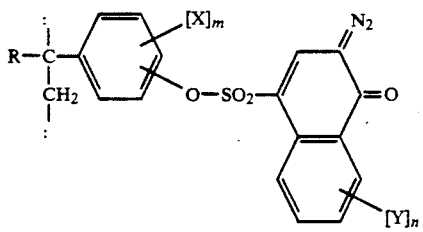

in a numerical ratio of units (a) to units (b) of 98:2 to 75:25, where

R is a hydrogen atom or a ($C_1$–$C_4$)alkyl group,

X is a ($C_1$–$C_6$)alkyl, ($C_1$–$C_6$)alkoxy-($C_1$–$C_6$)alkyl, carboxyl, formyl, ($C_1$–$C_{15}$)alkoxycarbonyl, ($C_2$–$C_5$)alkanoyl, ($C_2$–$C_5$)alkanoyloxy, ($C_1$–$C_6$)-alkoxy group or a halogen atom, Y is a ($C_1$–$C_5$)alkyl, ($C_1$–$C_5$)alkoxy or a halogen atom, and m and n independently of one another are 0, 1 or 2, whereby the radicals X and/or Y can be different if $m=2$ and/or $n=2$.

The radical Y stands for a halogen atom, an alkyl group or an alkoxy group. Suitable alkyl groups include methyl, ethyl, n-propyl and higher n-alkyl groups. The methyl group is particularly preferred. Generally, preference is given to short-chain alkyl radicals Y. Suitable alkoxy groups include methoxy groups, ethoxy groups and higher n-alkoxy groups, in particular, the methoxy group. Particular preference is given to short-chain alkoxy radicals Y. The number n of Y substituents is preferably 1 or 2, preferably n is 1. If Y denotes a halogen atom, this preferably is bromine and n then preferably is 1. The position of the substituents Y on the aromatic ring and the substitution pattern, if 2 substituents are present, are not subject to any restrictions. If Y denotes an alkoxy radical, it preferably is in the 7-position.

The present invention also relates to a radiation-sensitive mixture which, in addition to the polymer, comprises a compound containing at least one C—O—C or C—O—Si bond which can be split by acid, and optionally a compound which forms a strong acid under the action of actinic radiation.

In addition to the units of the general formula I or II, the radiation-sensitive polymers can also contain other units. The solubility and the transparency (in the desired wavelength range) can be adjusted in a desired manner by the incorporation of such additional units in the radiation-sensitive polymer.

The radiation-insensitive polymer on which the radiation-sensitive polymer binder is based contains only groups of the general formula I. Suitable polymers containing such groups are, for example, transparent novolaks and homopolymers from the class comprising poly(hydroxy)styrenes, monosubstituted ($m=1$) and disubstituted ($m=2$) poly(hydroxy)styrenes, substituted and unsubstituted poly(α-methylhydroxystyrenes).

Furthermore, copolymers and terpolymers of such monomers and others which contain no optionally substituted hydroxyphenyl groups are also suitable. Suitable comonomers and termonomers are, for example, styrene, maleimide, N-substituted maleimides, vinyl alkyl ethers and vinyltrialkylsilanes. N-substituted maleimides here denote maleimides which carry an aliphatic, cycloaliphatic, araliphatic or aromatic substituent on the nitrogen atom. Cyclohexyl is a preferred substituent Among the vinyl alkyl ethers, those having a medium- or long-chain alkyl radical, e.g., n-hexyl, n-octyl, n-decyl and n-octadecyl, are preferred. Among the vinyltrialkylsilanes, those having a short-chain alkyl radical, e.g., methyl, are preferred.

Homopolymers, copolymers and terpolymers are always preferred to blends. The proportion of such "other" monomers in the polymer can differ substantially. Thus, the proportion of styrene in a styrene/hydroxystyrene copolymer can be, for example, up to about 85% by weight.

The radiation-sensitive binders according to the invention prepared from these polymers are particularly distinguished by the fact that they readily dissolve the other constituents of the radiation-sensitive mixture according to the invention and have a low inherent absorption, i.e., high transparency, particularly in the wavelength range from about 190 to 300 nm, and bleach severely on exposure to actinic radiation. These conditions are not met by known binders based on conventional novolaks.

However, novolaks can also be used in the mixture according to the invention if they are mixed with other binders of higher transparency, which are described in more detail below. The mixing ratio depends on the structure of the highly transparent binder, which determines the degree of inherent absorption in the specified wavelength range, but also the miscibility with the other constituents of the radiation-sensitive mixture. In general, the binder mixture can contain up to about 25% by weight, preferably up to about 15% by weight, of a novolak.

Upon irradiation with light having a wavelength of about 248 nm, suitable novolaks or novolak mixtures, in a layer of about 1.0 μm thick, have an extinction of less than about 0.5; their average molecular weight is between about 500 and 30,000.

Among the unsubstituted poly(hydroxy)styrenes (PHS), the copolymers of 4-hydroxystyrene are important and among the substituted PHS the homopolymers and copolymers of 3-alkyl- and 3,5-dialkyl-4-hydroxystyrene are important. The average molecular weight is between about 3,000 and 300,000, but preferably between about 5,000 and 100,000, and particularly preferably between about 10,000 and 50,000.

In the case of the monosubstituted poly(4-hydroxy)-styrenes, the substituents X are preferably ($C_1$–$C_5$)alkyl and ($C_1$–$C_5$)alkoxy groups. Particularly suitable alkyl groups are methyl, ethyl and n-propyl groups. However, the radicals X having a lower number of carbon atoms are preferred. The methyl group is particularly preferred. The number m of substituents X is 0, or 2, preferably 1. If m is 2, X is preferably methyl.

Suitable copolymers and terpolymers containing units of the general formula I contain, for example, units of 4-hydroxystyrene and/or one or two of the following monomers: 3,5-dialkyl-4-hydroxystyrene, 3-alkyl-4-hydroxystyrene, 3-hydroxystyrene, vinyl ($C_1$–$C_{25}$)alkyl ethers, and styrene. The average molecular weight of the various copolymers and terpolymers is between about 3,000 and 300,000, preferably between about 5,000 and 100,000 and particularly preferably between about 10,000 and 50,000. This average molecular weight is for the polymer containing only units of general formula I, i.e., exclusive of the sulfonyl group-containing side chains of the groups of general formula II which impart the radiation sensitivity to the molecule. The average molecular weight of the polymers additionally containing units of the general formula II, which polymers are derived by converting some of the units of polymers composed entirely of units of the general formula I, is, of course, slightly higher.

Mixtures having increased stability towards oxygen plasma are obtained if silicon-containing vinyl monomers, for example, vinyltrimethylsilane, are used to prepare the copolymers or terpolymers. The transparency of these binders is generally even higher in the DUV range, so that an improved imaging is possible.

Copolymers of the various hydroxystyrenes with N-substituted maleimides can also be used with equal success. The substituents on the nitrogen atom of the maleimide are aliphatic, cycloaliphatic, araliphatic and also aromatic radicals. These may be either substituted or unsubstituted. Particularly preferred N-substituents are the phenyl radical and the cycloalkyl radical.

In principle, virtually all polymers can be used which contain phenolic hydroxyl groups and no other groups reacting with sulfonyl chlorides, or which, under the reaction conditions described, react with uniform ester formation.

Overall, the following may be mentioned as particularly preferred binders containing groups of the general formula I: poly(3-methyl-4-hydroxy)styrene, copolymers of 3-methyl-4-hydroxystyrene and 4-hydroxystyrene, copolymers of 3,5-dimethyl-4-hydroxystyrene and 4-hydroxystyrene, and also copolymers of 4-hydroxystyrene and styrene. Blends of these and other polymers are also suitable.

The amount of binder in the radiation-sensitive mixture is generally about 40 to 100% by weight, in particular about 50 to 95% by weight and preferably about 60 to 90% by weight, based on the total weight of solid contained therein. It is clear from this that in the extreme case, a radiation-sensitive polymer on its own, without the addition of an acid-cleavable compound containing a C—O—C or C—O—Si bond and a compound forming a strong acid on irradiation, is also suitable. However, such an embodiment is not preferred.

The ratio of the polymer units containing groups of the general formula I to those containing groups of the general formula II varies between about 98:2 and 75:25, preferably between about 97:3 and 85:15. The optimum ratio is dependent primarily on the structure of the binder and thus on the solubility of the resulting formulation and also on the transparency of the layer in the DUV region, especially at a wavelength of 248 nm.

The following classes of compound have proved to be particularly suitable as acid-cleavable materials in the radiation-sensitive mixture according to the invention:

(a) those containing at least one orthocarboxylic acid ester and/or carboxylic acid amidoacetal group, the compounds also having a polymer character and it being possible for the said groups to occur in the main chain or a side chain, (b) oligomeric or polymeric compounds containing recurring acetal and/or ketal groups in the main chain, (c) compounds containing at least one enol ether or N-acyliminocarbonate group, (d) cyclic acetals or ketals of β-ketoesters or β-ketoamides, (e) compounds containing silyl ether groups, (f) compounds containing silyl enol ether groups, (g) monoacetals or monoketals of aldehydes or ketones, the solubility of which in the developer is between 0.1 and 100 g/l, (h) ethers based on tertiary alcohols, and (i) carboxylic acid esters and carbonates, the alcohol of which is a tertiary alcohol, an allyl alcohol or a benzyl alcohol.

Acid-cleavable compounds have already been described briefly above. Acid-cleavable compounds of type (a) as components of radiation-sensitive mixtures are described in detail in DE 2,610,842 and DE 2,928,636. Mixtures which contain compounds of type (b) are disclosed in DE 2,306,248 and DE 2,718,254. Compounds of type (c) are described in EP 6,626 and EP 6,627. Compounds of type (d) are proposed in EP 202,196 and compounds which are to be regarded as being of type (e) are proposed in DE 3,544,165 and DE 3,601,264. Compounds of type (f) are found in DE 3,730,785 and DE 3,730,783, while compounds of type (g) are discussed in DE 3,730,787. Compounds of type (h) are described, for example, in U.S. Pat. No. 4,603,101 and compounds of type (i), for example, in U.S. Pat. No. 4,491,628 and by J. M. Fréchet et al., *J. Imaging Sci.* 30, 59–64 (1986).

Mixtures of the above-mentioned acid-cleavable materials can also be employed. However, use of an acid-cleavable material which can be assigned only to one of the above-mentioned categories is preferred, especially a material having at least one C—O—C bond cleavable by acid, i.e., those materials which belong to the types (a), (b), (g) and (i) are particularly preferred. Under type (b), the polymeric acetals are particularly important; among the acid-cleavable materials of type (g) those are preferred which are derived from aldehydes or ketones having a boiling point above about 150° C., preferably above about 200° C.

The content of acid-cleavable material in the radiation-sensitive mixture according to the invention should be about 1 to 50% by weight, preferably about 10 to 40% by weight, in each case based on the total weight of the layer.

Compounds that liberate a strong acid under the action of actinic radiation and are suitable for the mixture according to the invention have already been described in detail above. The use of specific photolytic acid-forming agents, such as onium salts, halogen compounds and nitrobenzyltosylates, is, however, associated with certain disadvantages which drastically limit the possibilities for use of the substances in various fields of application. These disadvantages are described in detail in DE 3,930,086.

Preferred photolytic acid-forming agents are, therefore, compounds which form strong acids, but which do not have a corrosive action, e.g., sulfonic acids. Preferred acid-forming agents of this type are, for example, bis(sulfonyl)diazomethanes (DE 3,930,086), sulfonylcarbonyldiazomethanes (DE 3,930,087) or o-diazonaphthoquinone-4-sulfonates. Bis(sulfonyl)-diazomethanes are particularly preferred.

The content of photoactive acid-forming agents in the mixture according to the invention is generally between about 0.5 and 15% by weight, preferably between about and 10% by weight and particularly preferably between about 2 and 7% by weight, in each case based on the total weight of the layer.

Upon exposure of the mixture according to the invention to actinic radiation a strong acid is formed by photolysis of the photoactive acid-forming agent, which acid causes cleavage of the C—O—C or C—O—Si bonds in the acid-labile compounds, as a result of which the exposed regions of the photosensitive layers become soluble in an aqueous-alkaline developer. This effect is intensified by the conversion of the diazoketo function in the side chain of the radiation-sensitive polymer units of the binder into a carboxylic acid function.

The radiation-sensitive mixture according to the invention is distinguished by a good differentiation between exposed and unexposed regions of the layer and by a high photosensitivity over a broad spectral range. It has a high thermal stability and allows detail-accurate reproduction of even extremely fine structures in an original. Preferably, no corrosive products are liberated as a result of the exposure, so that the mixture can also be used on sensitive substrates.

The radiation-sensitive binders according to the invention which contain groups of the general formula II and have been characterized in more detail above are outstandingly suitable as radiation-sensitive polymers in a radiation-sensitive mixture for the production of high-resolution photoresists for microlithography. The compounds according to the invention are particularly suitable for exposure to actinic radiation. In this context, actinic radiation should be understood to be any radiation whose energy corresponds at least to that of shortwave visible light. UV radiation in the range from about 190 to 450 nm, preferably from about 200 to 400 nm and particularly preferably from about 200 to 300 nm, and also electron radiation or X-rays are particularly suitable.

The polymers of this invention with naphthoquinone-2-diazide-4-sulfonic acid ester side groups are preferably prepared in accordance with one of the customary processes known from the literature. Because these are so well-known, a detailed description of the general preparation process is not necessary.

Advantageously, the polymer possessing units of the general formula I, which is used as the starting material, is dissolved in about 5 to 100 times, preferably about 20 to 50 times, its quantity of a suitable solvent, i.e., of a solvent which does not react with alcohols or sulfonyl chlorides, if appropriate with heating. Suitable solvents include, for example, ketones, such as acetone or methylethylketone; ethers, such as 1,2-dimethoxyethane or dioxane; alcohol ethers, such as ethylene glycol monomethyl ether; and aliphatic nitriles, such as acetonitrile; or mixtures of several of these solvents. If necessary, a dissolution-enhancing agent can be added. Subsequently, the optionally substituted naphthoquinone-2-diazide-4-sulfonyl halide is added in an amount sufficient to achieve the desired degree of conversion. Thereafter, a base, such as pyridine, triethylamine or N-methylpyrrolidone, is added dropwise without interruption, and the resulting mixture is stirred for about 1 to 24 hours, preferably for about 2 to 6 hours, at a temperature of between about $-40°$ C. and $+80°$ C., preferably between about $-10°$ C. and $+25°$ C. The progress of the reaction can be monitored by means of thin film chromatography (silica gel, flow agent: mixtures with ethyl acetate), by controlling the decrease in naphthoquinone-2-diazide-4-sulfonyl chloride. Alternatively, it is possible first to introduce the polymer possessing polymer units of the general formula I and a portion or the whole amount of the base and then to add the corresponding naphthoquinone-2-diazide-4-sulfonyl chloride.

Thereafter, the reaction mixture is filtered. The resulting dark brown filtrate is added dropwise to dilute aqueous hydrochloric acid, and the precipitate formed is removed by suction and washed with water repeatedly. If necessary, the precipitation can be repeated one or more times.

The radiation-sensitive polymers according to this invention with units of the general formula II that are obtained in this way are in most cases available in a highly pure form after drying under high vacuum, so that they can be used without further purification. If desired, they can be further purified by means of known methods, for example, by chromatography such as preparative gel permeation chromatography (GPC).

Furthermore, dyes, pigments, wetting agents and levelling agents, but also other auxiliaries, such as polyglycols and cellulose ethers, in particular ethylcellulose, can optionally be added to the radiation-sensitive mixtures according to the invention in order to meet specific requirements, such as flexibility, adhesion and gloss.

Preferably, the radiation-sensitive mixture according to the invention is dissolved in a solvent or in a combination of solvents. Solvents particularly suitable for this purpose are ethylene glycol and propylene glycol as well as the monoalkyl and dialkyl ethers derived therefrom, in particular the monomethyl and dimethyl ethers and also the monoethyl and diethyl ethers, esters derived from aliphatic $(C_1-C_6)$carboxylic acids and either $(C_1-C_8)$alkanols or $(C_1-C_8)$alkanediols or $(C_1-C_6)$alkoxy-$(_1-C_8)$alkanols, for example, ethyl acetate, hydroxyethyl acetate, alkoxyethyl acetate, n-butyl acetate, propylene glycol monoalkyl ether acetate, in particular propylene glycol methyl ether acetate and amyl acetate, ethers, such as tetrahydrofuran and dioxane, ketones, such as methyl ethyl ketone, methyl isobutyl ketone, cyclopentanone and cyclohexanone, and N,N-dialkylcarboxylic acid amides, such as N,N-dimethylformamide and N,N-dimethylacetamide, but also hexamethylphosphoric acid triamide, N-methyl-pyrrolidin-2-one and butyrolactone, as well as any desired mixtures thereof. Among these solvents, the glycol ethers, aliphatic esters and ketones are particularly preferred.

Ultimately the choice of the solvent or solvent mixture depends on the coating method used, the desired layer thickness and the drying conditions. The solvent must also be chemically inert towards the other layer constituents under the conditions employed. The mixture dissolved in the solvents as a rule has a solids content of about 5 to 60% by weight, preferably up to about 50% by weight.

The present invention also relates to a radiation-sensitive recording material which is essentially composed of a substrate and a radiation-sensitive mixture applied thereto. Suitable substrates are all materials from which capacitors, semiconductors, multilayer printed circuits or integrated circuits can be composed or produced. Silicon substrates, which can also be oxidized by the action of heat and/or coated with aluminum, or also doped, should be mentioned in particular. In addition, all other substrates customary in semiconductor technology are possible, such as silicon nitride, gallium arsenide and indium phosphide. Further suitable substrates are the substrates known from the production of liquid crystal displays, such as glass and indium-tin oxide, and also metal plates and metal foils, for example, those made of aluminum, copper or zinc, bimetal and trimetal foils, also electrically non-conducting films on which metals have been vapor-deposited, and paper. These substrates can be subjected to a heat pretreatment, surface-roughened, etched or, in order to improve the desired characteristics, for example, in order to increase the hydrophilic character, pretreated with chemicals.

In order to provide the radiation-sensitive layer with a better cohesion and/or a better adhesion to the substrate surface, this layer can contain an adhesion promoter. In the case of silicon or silicon dioxide substrates, adhesion promoters are those of the aminosilane type such as 3-aminopropyltriethoxysilane or hexamethyldisilazane.

Suitable supports for the production of photomechanical recording layers such as printing forms for letterpress printing, planographic printing, screen printing and flexographic printing are, in particular, aluminum plates, which optionally have been anodically oxidized, grained and/or silicate-treated beforehand, and also zinc plates and steel plates which optionally have been chromium-plated, as well as plastic films and paper.

The recording material according to the invention is exposed imagewise using actinic radiation. Suitable radiation sources are, in particular, metal halide lamps, carbon arc lamps, xenon lamps and mercury vapor lamps. Exposure can also be carried out using high-energy radiation such as laser or electron radiation or X-rays. However, lamps which are able to emit light having a wavelength of about 190 to 260 nm, i.e., in particular xenon lamps and/or mercury vapor lamps, are preferred. In addition, laser light sources can also be used, for example excimer lasers, in particular KrF or ArF lasers which emit at 248 or 193 nm, respectively. The radiation sources must have an adequate emission in the specified wavelength ranges.

The thickness of the light-sensitive layer depends on the intended use. It is generally between about 0.1 and 100 μm, preferably between about 0.5 and 10 μm and particularly preferably about 1.0 μm thick.

The present invention also relates to a process for the production of a radiation-sensitive recording material. The radiation-sensitive mixture can be applied to the substrate by spraying on, flow coating, rolling, spin-coating and dip-coating. The solvent is then removed by evaporation, so that the radiation-sensitive layer remains behind on the surface of the substrate. The removal of the solvent optionally can be promoted by heating the layer to a temperature of up to about 150° C. However, the mixture can also first be applied in the above-mentioned manner to a temporary support, from which it is then transferred to the final support material under pressure and at elevated temperature. In principle, all materials which are suitable as support materials can be used as temporary support. The layer is then irradiated imagewise and treated with a developer solution, which dissolves and removes the irradiated regions of the layer, so that an image of the original used for the imagewise exposure remains behind on the substrate surface.

Suitable developers are, in particular, aqueous solutions which contain silicates, metasilicates, hydroxides, hydrogen phosphates and dihydrogen phosphates, carbonates and hydrogen carbonates of alkali metal, alkaline earth metal and/or ammonium ions, but also ammonia and the like. Metal-ion-free developers are described in U.S. Pat. No. 4,729,941, EP 62,733, U.S. Pat. Nos. 4,628,023, 4,141,733, EP 97,282 and EP 23,758. The content of these substances in the developer solution is generally about 0.1 to 15% by weight, preferably about 0.5 to 5% by weight, based on the weight of the developer solution. Metal-ion-free developers are preferably used. If appropriate, small amounts of a wetting agent can be added to the developers in order to facilitate removal of the exposed areas by the developer.

The developed layer can be post-cured. This is generally effected by heating on a hot plate up to a temperature below the flow point and subsequently exposing the entire surface to UV light from a xenon/mercury vapor lamp (range from about 200 to 250 nm). As a result of the post-curing, the image structures are cross-linked, so that they generally exhibit flow resistance up to temperatures in excess of 200° C. The post-curing can also be effected without a rise in temperature, solely by irradiation with high-energy UV light.

The compounds according to the invention are used in radiation-sensitive mixtures for the production of integrated circuits or of discrete electrical components in lithographic processes, since they have a high photosensitivity, especially upon irradiation with light having a wavelength between about 190 and 300 nm. Since the mixtures bleach very well on exposure, imaging can be achieved which is distinctly superior to that of the known mixtures with respect to resolution. The recording material produced from the mixture serves as a mask for the subsequent process steps. These include, for example, milling of the layer support, implantation of ions in the layer support or the deposition of metals or other materials on the layer support.

The following examples are intended to illustrate the preparation of the radiation-sensitive polymers according to the invention and their use. However, they are not intended to restrict the invention in any way.

PREPARATION EXAMPLES

EXAMPLE 1

Linking of naphthoquinone-2-diazide-4-sulfonyl side groups to a copolymer of 3-methyl-4-hydroxystyrene and 4-hydroxystyrene (75:25)

An amount of 15.8 g of a copolymer of 3-methyl-4-hydroxystyrene and 4-hydroxystyrene (75:25), which contains 120 mmol of hydroxy groups and has a mean molecular weight of 24,000, is dissolved in a mixture of 200 ml of acetone and 500 ml of N-methyl-pyrrolidone and mixed with 4.84 g (18.0 mmol) naphthoquinone-2-diazide-4-sulfonyl chloride. Then 2.00 g (19.8 mmol) trieth are added, and the dark mixture is stirred at a temperature of 20° to 25° C. After about 4 hours, naphthoquinone-2-diazide-4-sulfonyl chloride can no longer be traced in a thin layer chromatogram (silica gel, flow agent: ethyl acetate/petroleum ether). Any insoluble remainders which remain are filtered off, and the reaction mixture is dropwise added to a solution prepared from 7.0 L of water and 40 ml of concentrated hydrochloric acid. The yellow residue is removed by suction, washed three times with 200 ml cold water and then dried under a high vacuum. In this way, a slightly yellowish powder is obtained which consists almost exclusively of the radiation-sensitive polymer having naphthoquinone-2-diazide-4-sulfonyl side groups.

IR (KBr): 2.145 cm$^{-1}$ (C=N$_2$).

If required, the polymer is taken up in acetone and reprecipitated by adding it dropwise to a solution of water and hydrochloric acid. In a few cases preparative GPC was used for further purification.

Other polymers which contain units of the general formula II can be prepared in an analogous manner. A number of selected examples are listed in the Table below.

The radiation-sensitive polymers of this invention, comprising polymer units of the general formula I, were characterized by determination of the hydroxyl number and by IR spectra (C=N$_2$ oscillation) and elemental analyses. All experimental values agreed well with the values calculated theoretically. The product yields were good or even very good in all cases.

EXAMPLES 2 TO 23

| No. | Monomer a) | Polymer Ratio | Type b) | Y | Content c) [%] |
|---|---|---|---|---|---|
| 2 | a | 100 | H | H | 10 |
| 3 | a | 100 | H | H | 15 |
| 4 | a | 100 | H | 7-OCH$_3$ | 5 |
| 5 | a:b | 75:25 | B | H | 8 |
| 6 | a:b | 75:25 | C | H | 8 |
| 7 | a:b | 65:35 | C | H | 12 |
| 8 | a:j | 75:25 | C | H | 8 |
| 9 | a:k | 90:10 | B | H | 3 |
| 10 | b:c | 50:50 | C | H | 5 |
| 11 | b:c | 60:40 | C | H | 12 |
| 12 | b:d | 20:80 | C | 8-CH$_3$ | 12 |
| 13 | b:d | 35:65 | C | 8-CH$_3$ | 20 |
| 14 | b:e | 50:50 | C | H | 8 |
| 15 | b:k | 15:85 | B | H | 8 |
| 16 | b:l:o | 30:20:50 | T | 7-OCH$_3$ | 10 |
| 17 | b:m:o | 25:25:50 | T | 7-OCH$_3$ | 10 |
| 18 | b:n:p | 20:30:50 | T | 7-OCH$_3$ | 10 |
| 19 | e | 100 | H | H | 12 |
| 20 | f | 100 | H | H | 15 |
| 21 | g | 100 | H | H | 10 |
| 22 | h | 100 | H | H | 5 |
| 23 | i | 100 | H | H | 3 | a) Monomer constituents (k=polymer): a=4-hydroxy-3-methylstyrene; b=4-hydroxystyrene; c=4-hydroxy-3,5-dimethylstyrene; d=styrene; e=3-ethyl-4-hydroxystyrene; f=4-hydroxy-3-methoxystyrene; g=3-hydroxystyrene; h=4-hydroxy-3-propylstyrene; i=3-butyl-4-hydroxystyrene; j=α-methyl-4-hydroxystyrene; k=novolak (resin S); l=n-octyl vinyl ether; m=n-octadecyl vinyl ether; n=trimethylvinylsilane; o=N-cyclohexylmaleimide; p=N-phenylmaleimide;

b) Binder type: B=blend (mixture), C=copolymer, H=homopolymer, T=terpolymer.

c) Content of polymer units of the general formula II, relative to the total number of polymer units contained in the binder.

USE EXAMPLES

The coating solutions were filtered through filters having a pore diameter of 0.2 μm and spin-coated onto a wafer pretreated with an adhesion promoter (hexamethyldisilazane). The speed of rotation of the spin-coater was chosen such that layer thicknesses of about 1.07 μm were obtained after drying at 90° C. for 1 minute on the hot plate.

The recording material was exposed imagewise under an original to the UV radiation from a KrF excimer laser (248 nm) or a xenon/mercury vapor lamp (260 nm, with interference filter) and then subjected to a post exposure bake at 70° C. for 1 minute on a hot plate.

The recording material was developed using a 0.27N aqueous tetramethylammonium hydroxide solution.

In the following Examples parts by weight are abbreviated to pwt.

EXAMPLE 24

A photosensitive recording material was prepared with the aid of a coating solution composed of
  4.5 pwt of the radiation-sensitive copolymer from Example 1,
  3.0 pwt of 3,4-methylendioxy-benzaldehyde-bis(phenoxyethyl)acetal, prepared analogously to Preparation Example 1 of DE 3,730,787, and
  42.5 pwt of propylene glycol monomethyl ether acetate.

Developing time: 60 seconds.
Exposure dose: 46 mJ/cm$^2$ (Excimer laser).

EXAMPLE 25

A photosensitive recording material was prepared with the aid of a coating solution composed of
  6.0 pwt of the radiation-sensitive terpolymer from Example 17,
  1.5 pwt of benzaldehyde-bis(phenoxyethyl)-acetal, prepared analogously to Preparation Example 1 of DE 3,730,787, and
  42.5 pwt of propylene glycol monomethyl ether acetate.

Developing time: 120 seconds.
Exposure dose: 50 mJ/cm$^2$ (Excimer laser).

EXAMPLE 26

A photosensitive recording material was prepared with the aid of a coating solution composed of
  8.5 pwt of the radiation-sensitive homopolymer from Example 4,
  1.5 pwt of terephthaldialdehyde-tetrakis(phenoxyethyl)acetal, prepared analogously to Preparation Example 1 of DE 3,730,787, and
  42.0 pwt of propylene glycol monomethyl ether acetate.

Developing time: 100 seconds,
Exposure dose: 47 mJ/cm$^2$ (Excimer laser).

EXAMPLE 27

A photosensitive recording material was prepared with the aid of a coating solution composed of
- 7.0 pwt of the radiation-sensitive homopolymer from Example 19,
- 3.0 pwt of 3,4-methylendioxy-benzaldehyde-bis(3-phenyl-propyl)acetal, prepared analogously to Preparation Example 1 of DE 3,730,787, and
- 0.3 pwt of bis (4-tert.-butyl-benzenesulfonyl)diazomethane (DE 3,930,086), and
- 40.0 pwt of propylene glycol monomethyl ether acetate.

Developing time: 75 seconds.
Exposure dose: 44 mJ/cm² (xenon/mercury vapor lamp).

EXAMPLE 28

A wafer coated in accordance with Example 24 was irradiated under an original with UV light from a xenon/mercury vapor lamp with an energy of 49 mJ/cm².
Developing time: 60 seconds.

EXAMPLE 29

A photosensitive recording material was prepared analogously to Example 24 but using 3.0 pwt terephthalic dialdehyde tetrakis(phenoxyethyl)acetal instead of 3.0 pwt 3,4-methylendioxybenzaldehyde-bis(phenoxyethyl)acetal as the acid-labile component.
Developing time: 50 seconds.
Exposure dose: 43 mJ/cm² (Excimer laser).

EVALUATION OF THE DEVELOPED RECORDING MATERIALS

The resist patterns obtained according to Examples 24 to 29 are a defect-free image of the mask with steep resist edges, structures less than or equal to 0.50 μm also being reproduced in accurate detail.

Examination of the edges of the resist profiles using scanning electron microscopy confirmed that these were aligned virtually vertically to the substrate surface.

The layer removal from the unexposed resist regions was in all cases less than 20 nm/min. The sensitivity of the resist formulation was, in all cases less than 50 mJ cm².

EXAMPLE 30 (COMPARISON EXAMPLE)

The coating solution according to Example 24 was modified by replacing the radiation-sensitive binder according to the invention used in that example with an equal amount of poly(3-methyl-4-hydroxystyrene) MW (GPC)=28,200] and by using 0.8 pwt of naphthoquinone-2-diazide-4-sulfonic acid ester of 4,4'-bis-(4-hydroxy-phenyl)-n-valeric acid-(2-ethoxy-ethyl)-ester as the photoactive acid former. Following exposure to radiation having a wavelength of 248 nm and an energy of 65 mJ/cm² and developing, structures were obtained, the resolution limit of which was reached at about 0.7 μm lines and spacings.

What is claimed is:

1. A radiation-sensitive polymer, comprising
(a) units of the general formula I

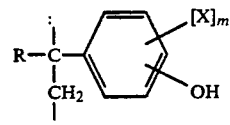

and
(b) units of the general formula II

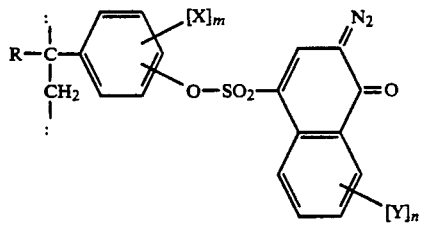

wherein the numerical ratio of units (a) to units (b) is about 98:2 to 75:25, and wherein R is a hydrogen atom or a $(C_1-C_4)$alkyl group, X is a $(C_1-C_6)$alkyl, $(C_1-C_6)$alkoxy-$(C_1-C_6)$alkyl, carboxyl, formyl, $(C_1-C_{15})$alkoxycarbonyl, $(C_2-C_5)$alkanoyl, $(C_2-C_5)$alkanoyloxy, or a $(C_1-C_6)$-alkoxy group, Y is a $(C_1-C_5)$alkyl, $(C_1-C_5)$alkoxy or a halogen atom, m is 1 or 2, wherein the radicals X can be different if m=2, and n is 0, 1 or 2, wherein the radicals Y can be different if n=2.

2. The radiation-sensitive polymer as claimed in claim 1, wherein the numerical ratio of the units of the general formula I to those of the general formula II is in the range from about 97:3 to 85:15.

3. The radiation-sensitive polymer as claimed in claim 1, wherein the polymer is one of a copolymer and a terpolymer.

4. The radiation-sensitive polymer as claimed in claim 1, wherein R is hydrogen.

5. The radiation-sensitive polymer as claimed in claim 4, wherein the hydroxystyrene is a substituted 4-hydroxystyrene.

6. The radiation-sensitive polymer as claimed in claim 4, wherein the substituted hydroxystyrene has at least one substituent selected from the group consisting of methyl, ethyl, propyl, methoxy and ethoxy.

7. The radiation-sensitive polymer as claimed in claim 4, wherein the average molecular weight of the polymer, exclusive of the sulfonyl group containing side chains, is about 3,000 to 300,000.

8. The radiation-sensitive polymer as claimed in claim 4, wherein the average molecular weight of the polymer, exclusive of the sulfonyl group containing side chains, is about 5,000 to 100,000.

9. The radiation-sensitive polymer as claimed in claim 4, wherein the average molecular weight of the polymer, exclusive of the sulfonyl group-containing side chains, is about 10,000 to 50,000.

10. The radiation-sensitive polymer as claimed in claim 1, comprising additional monomeric units.

11. The radiation-sensitive polymer as claimed in claim 10, wherein the additional monomeric units are derived from styrene.

12. The radiation-sensitive polymer as claimed in claim 10, wherein the additional monomeric units are selected from the group consisting of N-substituted maleimide, vinyl alkyl ether and vinyltrialkylsilane.

13. The radiation-sensitive polymer as claimed in claim 1, wherein n is 1 or 2.

14. The radiation-sensitive polymer as claimed in claim 13, wherein Y is bromine and n is 1.

15. The radiation-sensitive polymer as claimed in claim 13, wherein Y is methyl or methoxy.

16. The radiation-sensitive polymer as claimed in claim 13, wherein Y is an alkoxy radical in the 7-position.

17. The radiation-sensitive polymer as claimed in claim 1, wherein X is $(C_1-C_5)$alkyl or $(C_1-C_5)$alkoxy.

18. The radiation-sensitive polymer as claimed in claim 17, wherein m is 1.

19. The radiation-sensitive polymer as claimed in claim 1, wherein X is methyl, ethyl or n-propyl.

20. The radiation-sensitive polymer as claimed in claim 1, wherein X is methyl.

21. The radiation-sensitive polymer as claimed in claim 20, wherein m is 2.

22. The radiation-sensitive polymer as claimed in claim 1, consisting essentially of the (a) and (b) repeating units.

23. The radiation-sensitive polymer as claimed in claim 2, consisting essentially of the (a) and (b) repeating units.

24. A polymer blend which comprises at least one radiation-sensitive polymer as claimed in claim 1.

* * * * *